(12) United States Patent
Sonoda

(10) Patent No.: US 10,600,955 B2
(45) Date of Patent: Mar. 24, 2020

(54) SEMICONDUCTOR STORAGE DEVICE AND METHOD OF MANUFACTURING THE SAME

(71) Applicant: TOSHIBA MEMORY CORPORATION, Minato-ku, Tokyo (JP)

(72) Inventor: Yasuyuki Sonoda, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/126,349

(22) Filed: Sep. 10, 2018

(65) Prior Publication Data

US 2019/0280187 A1    Sep. 12, 2019

(30) Foreign Application Priority Data

Mar. 9, 2018 (JP) ................. 2018-043150

(51) Int. Cl.
| | |
|---|---|
| *H01L 43/00* | (2006.01) |
| *H01L 43/02* | (2006.01) |
| *H01L 43/12* | (2006.01) |
| *H01L 27/22* | (2006.01) |

(52) U.S. Cl.
CPC ............ *H01L 43/02* (2013.01); *H01L 27/228* (2013.01); *H01L 43/12* (2013.01)

(58) Field of Classification Search
CPC ....... H01L 43/02; H01L 43/12; H01L 27/228; H01L 27/222; H01L 27/226; H01L 27/2463

USPC ............................................... 257/421
See application file for complete search history.

(56) References Cited

U.S. PATENT DOCUMENTS

| | | | |
|---|---|---|---|
| 8,772,888 B2 | 7/2014 | Jung et al. | |
| 9,054,305 B2 | 6/2015 | Ito et al. | |
| 9,595,563 B2 | 3/2017 | Ito et al. | |
| 2014/0042567 A1* | 2/2014 | Jung ...................... | H01L 43/08 257/421 |
| 2014/0117478 A1 | 5/2014 | Ikeno et al. | |
| 2016/0380028 A1 | 12/2016 | Sonoda et al. | |
| 2017/0069835 A1 | 3/2017 | Sonoda et al. | |

\* cited by examiner

*Primary Examiner* — Theresa T Doan

(74) *Attorney, Agent, or Firm* — Holtz, Holtz & Volek PC

(57) ABSTRACT

According to an embodiment, a semiconductor storage device includes a substrate. A stack is provided above the substrate, and includes a resistance change element and a metal layer provided above the resistance change element. A first insulating layer is provided on a side surface of the stack. A second insulating layer is provided on the first insulating layer. And an electrode is provided on the metal layer and on the first insulating layer so as to extend along a stacking direction in the second insulating layer. A lower surface of the electrode as viewed in the direction has a diameter greater than a diameter of an upper surface of the stack as viewed in the direction. A lowermost portion of the electrode is at a same level as an uppermost portion of the metal layer as viewed in the direction.

13 Claims, 18 Drawing Sheets

Parallel state (low resistance)

Anti-parallel state (high resistance)

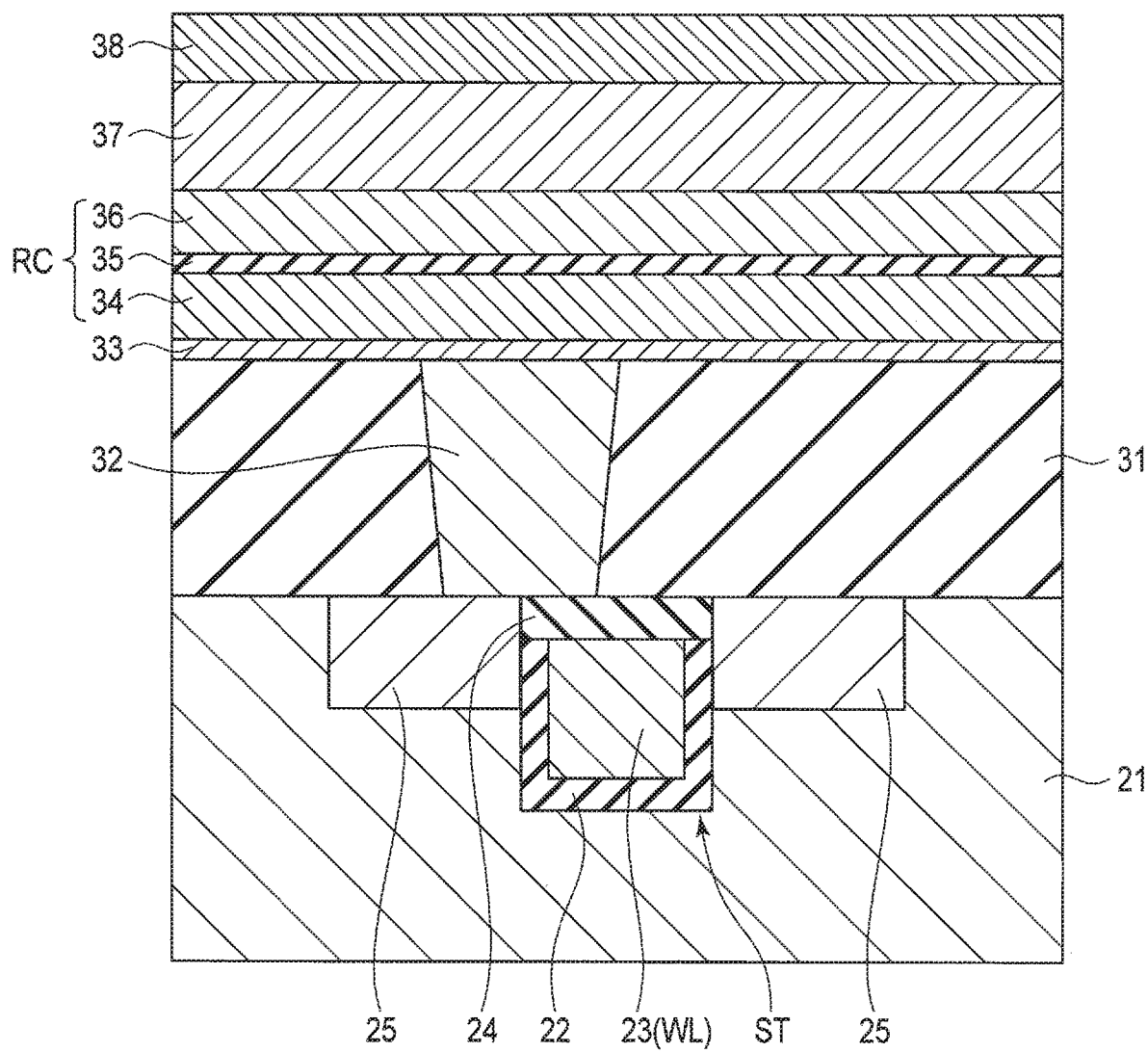
F I G. 7

SEMICONDUCTOR STORAGE DEVICE AND METHOD OF MANUFACTURING THE SAME

CROSS-REFERENCE TO RELATED APPLICATIONS

This application is based upon and claims the benefit of priority from Japanese Patent Application No. 2018-43150, filed Mar. 9, 2018, the entire contents of which are incorporated herein by reference.

FIELD

An embodiment described herein relates to a semiconductor storage device and a method of manufacturing the same.

BACKGROUND

Magnetic random-access memory (MRAM) is a memory device that employs a storage element with a magnetoresistive effect as a memory cell that stores information. MRAM receives attention as a next-generation memory device characterized by a high-speed operation, a large storage capacity, and non-volatility.

BRIEF DESCRIPTION OF THE DRAWINGS

FIG. 7 is a cross-sectional view illustrating a process of manufacturing the memory cell of the semiconductor storage device according to the embodiment.

DETAILED DESCRIPTION

Figure 1:
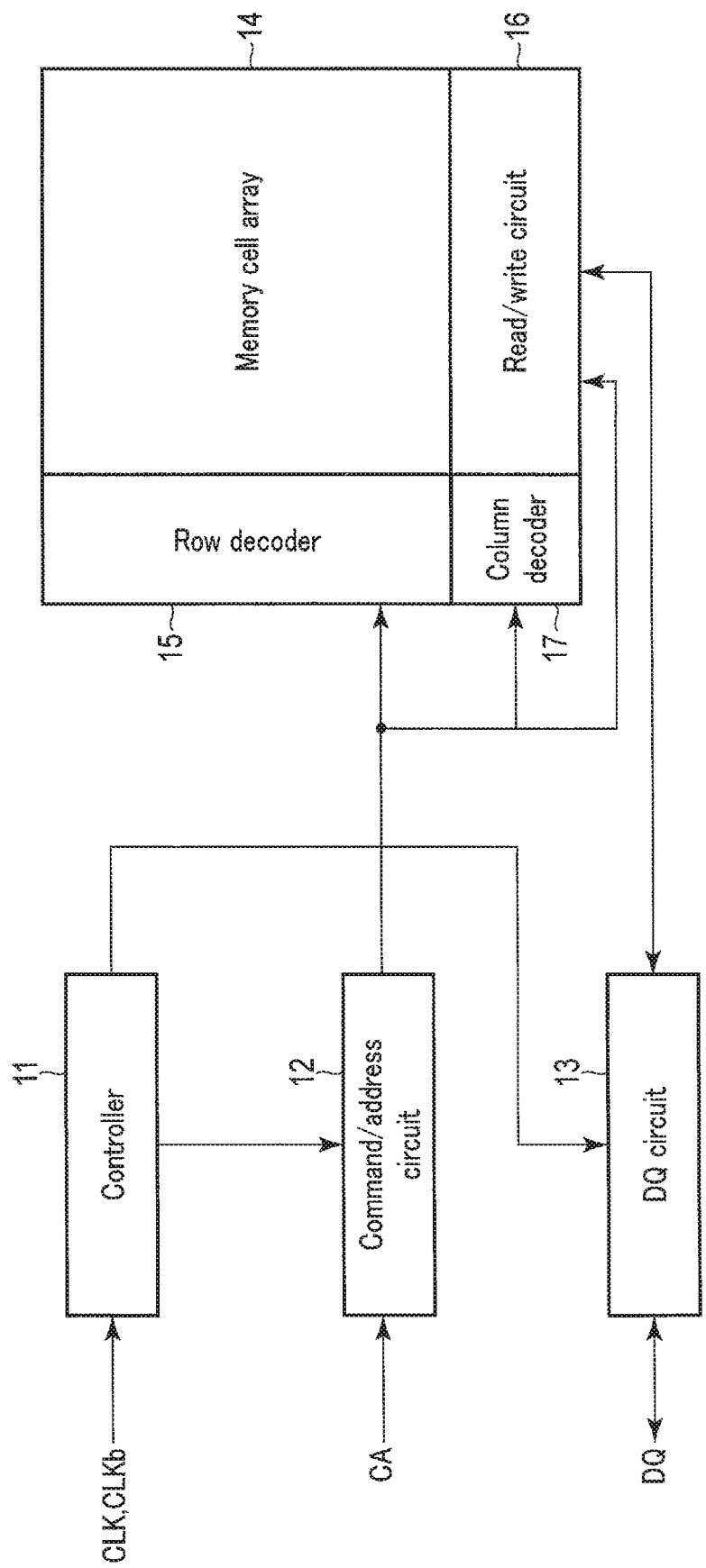
FIG. 1 is a block diagram illustrating an overall configuration of a semiconductor storage device according to an embodiment.

Generally, according to an embodiment, a semiconductor storage device includes a substrate. A stack is provided above the substrate, and includes a resistance change element and a metal layer provided above the resistance change element. A first insulating layer is provided on a side surface of the stack. A second insulating layer is provided on the first insulating layer. And an electrode is provided on the metal layer and on the first insulating layer so as to extend along a stacking direction in the second insulating layer. A lower surface of the electrode as viewed in the stacking direction has a diameter greater than a diameter of an upper surface of the stack as viewed in the stacking direction. A lowermost portion of the electrode is at a same level as an uppermost portion of the metal layer as viewed in the stacking direction.

Hereinafter, an embodiment will be explained with reference to the accompanying drawings. In the drawings, the same reference numerals or symbols are used to denote similar structural elements.

Embodiment

A semiconductor storage device according to an embodiment will be explained with reference to FIGS. 1 to 16. In the description that follows, an MRAM, which stores data using a magnetic tunnel junction (MTJ) element as a resistance change element, is taken as an example; however, the embodiment is not limited thereto. The present embodiment is applicable to any volatile or non-volatile memory that converts a resistance difference of a resistance change element into a current difference or a voltage difference and senses the current or voltage difference. The present embodiment is applicable to a resistance change type memory similar to MRAM; for example, a semiconductor storage device that includes an element in which data is stored using a resistance change, such as ReRAM and PCRAM.

In the description that follows, "coupling" means not only direct coupling, but also coupling that is provided via a given element, unless otherwise specified. A first terminal of a transistor refers to one of a source and a drain, and a second terminal of the transistor refers to the other one of either the source or drain. A control terminal of the transistor refers to a gate.

Configuration Example According to Embodiment

FIG. 1 is a block diagram illustrating an overall configuration of the semiconductor storage device according to the embodiment.

As shown in FIG. 1, the semiconductor storage device includes a controller 11, a command/address circuit 12, a data circuit 13, a memory cell array 14, a row decoder 15, a read/write circuit 16, and a column decoder 17.

The controller 11 receives clock signals CLK and CLKb, and external control signals from the outside (host device). The controller 11 includes elements such as a voltage generation circuit, and controls the command/address circuit 12 and the data circuit 13 on the basis of the control signals from the outside.

The command/address circuit 12 receives a command/address signal CA from the outside, and supplies a signal based thereon to the row decoder 15, the read/write circuit 16, and the column decoder 17.

The data circuit 13 transmits and receives data DQ to and from the outside and the read/write circuit 16. More specifically, the data circuit 13 transfers write data from the outside to the read/write circuit 16. The data circuit 13 transfers read data from the read/write circuit 16 to the outside.

The row decoder 15 selects a word line WL in accordance with a row address from the command/address circuit 12.

The column decoder 17 selects a bit line BL and a source line SL in accordance with a column address from the command/address circuit 12.

The read/write circuit 16 includes a sense amplifier, for example, and controls writing in the memory cell array 14 and reading from the memory cell array 14.

Figure 2:
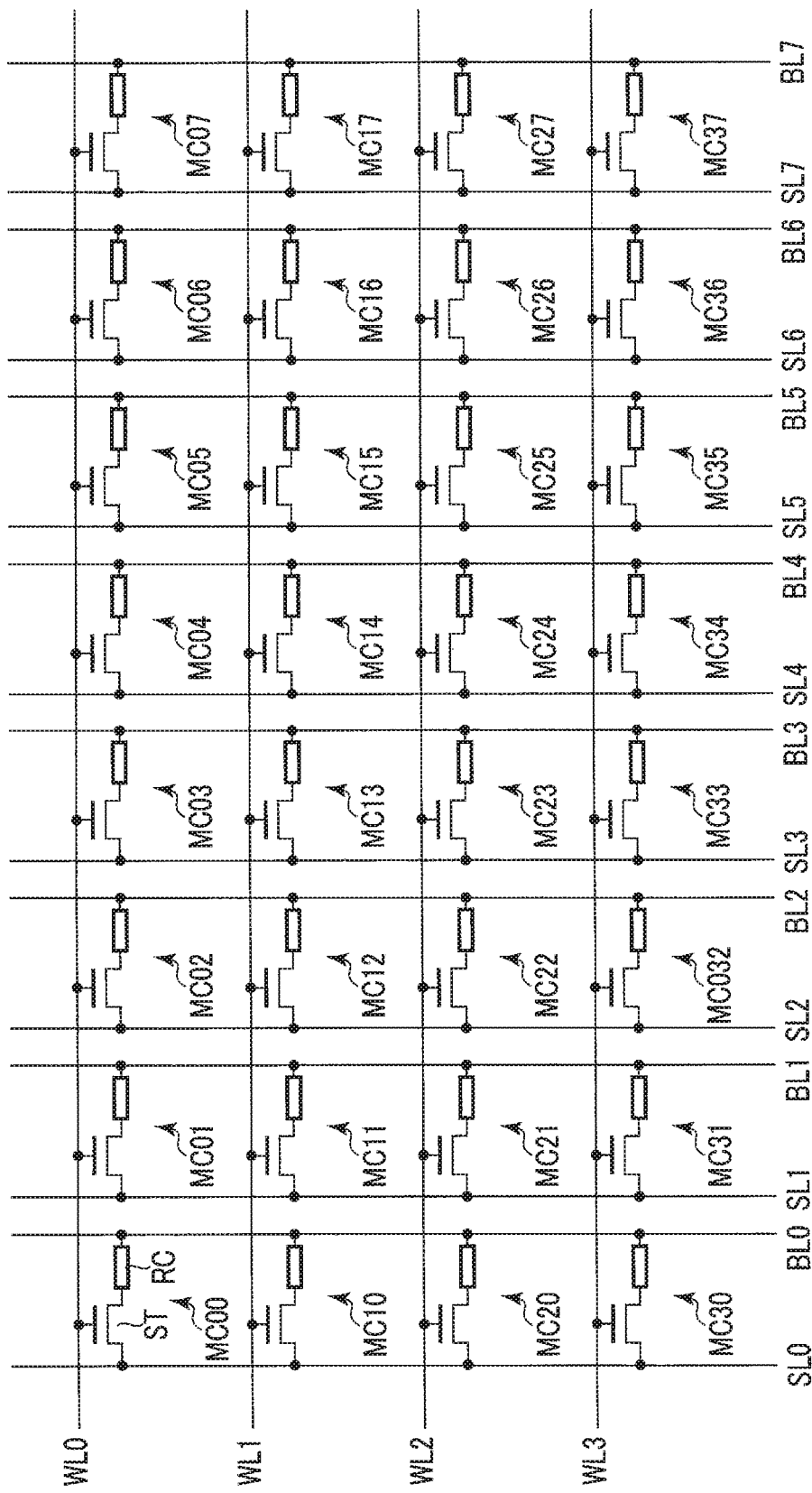
FIG. 2 is a diagram illustrating a memory cell array of the semiconductor storage device according to the embodiment.

FIG. 2 is a diagram illustrating the memory cell array 14 of the semiconductor storage device according to the embodiment.

As shown in FIG. 2, the memory cell array 14 includes bit lines BL (BL0-BL7), source lines SL (SL0-SL7), and word lines WL (WL0-WL3). The bit lines BL and the source lines SL extend along a first direction, and are alternately provided as viewed in a second direction orthogonal to the first direction. The word lines WL extend along the second direction. The memory cell array 14 includes a plurality of memory cells MC (MC00-MC07, MC10-MC17, MC20-MC27, and MC30-MC37). Each of the memory cells MC is provided at an intersection of the bit line BL and the source line SL with the word line WL. Thereby, the memory cells MC are arranged in a matrix pattern in relation to the first and second directions.

More specifically, the memory cells MC00-MC07 are respectively provided at intersections of the bit lines BL0-BL7 and the source lines SL0-SL7 with the word line WL0. The memory cells MC10-MC17 are respectively provided at intersections of the bit lines BL0-BL7 and the source lines SL0-SL7 with the word line WL1. The memory cells MC20-MC27 are respectively provided at intersections of the bit lines BL0-BL7 and the source lines SL0-SL7 with the word line WL2. The memory cells MC30-MC37 are respectively provided at intersections of the bit lines BL0-BL7 and the source lines SL0-SL7 with the word line WL3. The memory cells MC are electrically coupled to the bit lines BL, the source lines SL, and the word lines WL at the intersections.

The numbers of the bit lines BL, the source lines SL, and the word lines WL of the memory cell array 14 are merely examples, and are not limited thereto.

Each memory cell MC includes, for example, a resistance change element RC and a select transistor ST. A first terminal of the resistance change element RC is electrically coupled to a bit line BL, and a second terminal of the resistance change element RC is electrically coupled to a first terminal of the select transistor ST. A second terminal of the select transistor ST is electrically coupled to the source line SL, and the control terminal of the select transistor ST is electrically coupled to the word line WL.

The resistance change element RC changes its resistance when a current (or a voltage) is applied thereto. The resistance change element RC includes, for example, an MTJ element, a phase change element, and a ferroelectric element. A memory cell MC is selected when a corresponding select transistor ST is turned on by a word line WL. Herein, MRAM, namely, a case where the resistance change element RC is an MTJ element will be explained.

Figure 3:
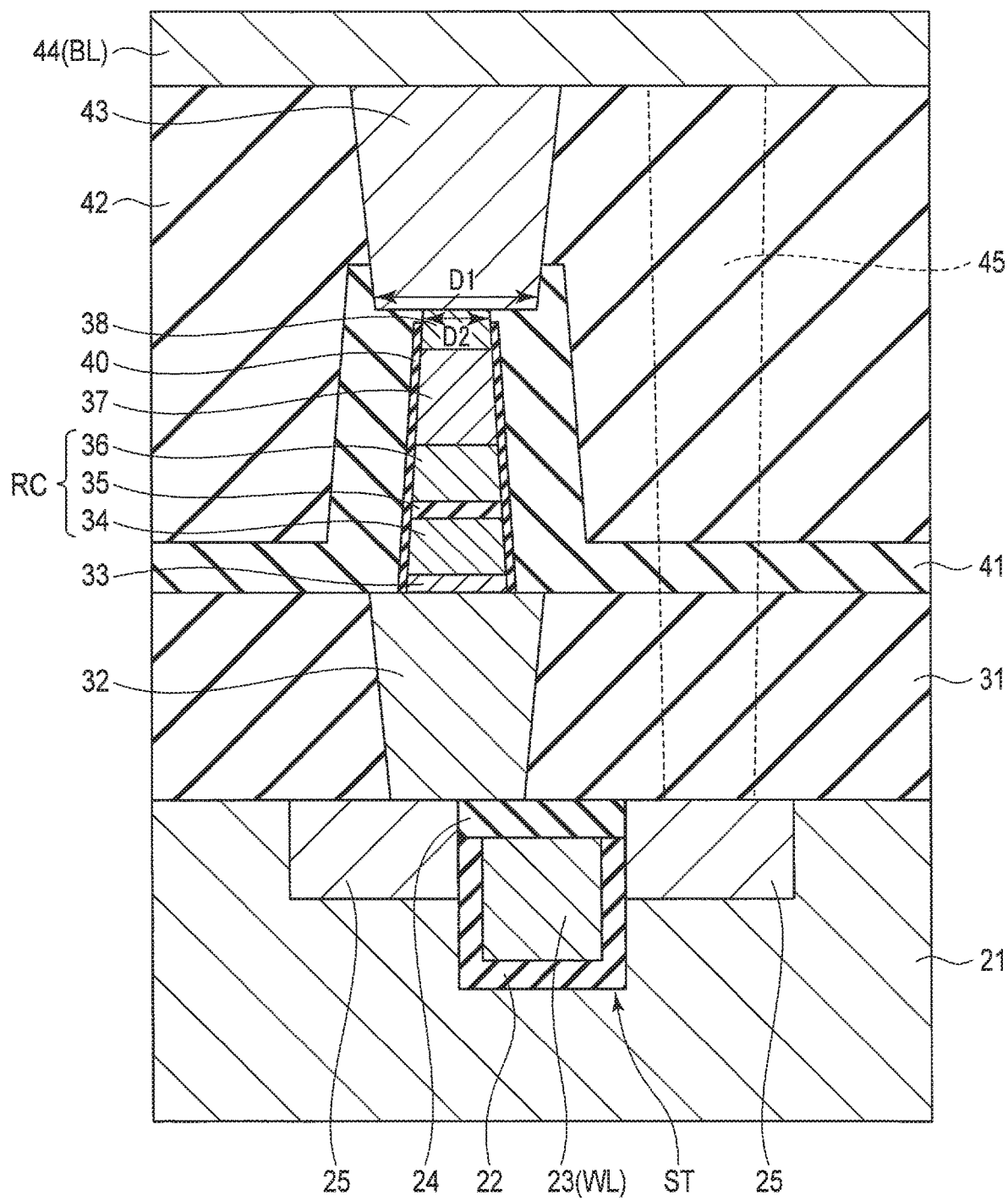
FIG. 3 is a cross-sectional view showing a memory cell of the semiconductor storage device according to the embodiment.

FIG. 3 is a cross-sectional view showing a memory cell MC of the semiconductor storage device according to the embodiment.

For convenience in explanation, the direction going from a semiconductor substrate 21 toward the resistance change element RC is referred to as "upper", and the direction going from the resistance change element RC toward the semiconductor substrate 21 is referred to as "lower", as viewed in the stacking direction (vertical direction shown in FIG. 3) in the present description; however, this notation is for convenience and is irrelevant to the direction of gravitational force.

As shown in FIG. 3, a memory cell MC of the semiconductor storage device includes, for example, a select transistor ST, a lower electrode 32, a resistance change element RC, and an upper electrode 43.

The select transistor ST is provided in a surface of the semiconductor substrate (silicon substrate) 21. The select transistor ST is, for example, a metal-oxide-semiconductor field-effect transistor (MOSFET). The select transistor ST includes a buried gate structure in a surface portion of the semiconductor substrate 21.

More specifically, the select transistor ST includes a gate insulating layer 22, a gate electrode 23, and two diffusion layers 25 (a drain-side diffusion layer and a source-side diffusion layer).

The gate insulating layer 22 is provided on an inner surface of a lower portion of a recess provided in the surface of the semiconductor substrate 21. The gate electrode 23 is provided on the inner surface of the gate insulating layer 22, so as to fill in the lower portion of the recess. The gate electrode 23 corresponds to the word line WL. An insulating layer 24 is provided on the gate insulating layer 22 and the gate electrode 23, so as to fill in an upper portion of the recess. The insulating layer 24 is formed of, for example, a silicon nitride layer including silicon nitride (SiN). The upper surface of the insulating layer 24 is at a same level as the upper surface of the semiconductor substrate 21. Two diffusion layers 25 are provided on the surface of the semiconductor substrate 21, so as to sandwich the gate insulating layer 22, the gate electrode 23, and the insulating layer 24.

The select transistor ST is not limited to a configuration including a buried gate structure. For example, the select transistor ST may be configured in such a manner that a gate electrode is formed via a gate insulating film on a surface of the semiconductor substrate 21. The select transistor ST may be any configuration that functions as a switching element.

An insulating layer 31 is provided on the semiconductor substrate 21 (the insulating layer 24 and the diffusion layer 25). The insulating layer 31 is formed of, for example, a silicon nitride layer including a silicon nitride, or a silicon oxide layer including a silicon oxide ($SiO_2$).

The lower electrode 32 is provided in a contact hole of the insulating layer 31. The lower electrode 32 extends along the stacking direction (vertical direction shown in FIG. 3) in the insulating layer 31. A lower surface of the lower electrode 32 is coupled to the diffusion layer 25 (drain). The lower electrode 32 is a metal layer containing a metal, and includes at least one of, for example, W, Ta, Ru, Ti, TaN, and TiN. The lower electrode 32 is formed in, for example, a columnar shape.

A buffer layer 33 is provided on at least part of the lower electrode 32. The buffer layer 33 is a metal layer, and includes at least one of, for example, Al, Be, Mg, Ca, Hf, Sr, Ba, Sc, Y, La, and Zr. The buffer layer 33 may include at least one of the compounds such as HfB, MgAlB, HfAlB, ScAiB, ScHfB, and HfMgB.

The resistance change element RC is provided on the buffer layer 33. The resistance change element RC includes a storage layer 34, a tunnel barrier layer 35, and a reference layer 36, which are arranged in this order from the upper side of the buffer layer 33. The storage layer 34 is a ferromagnetic magnetization free layer, and includes, for example, CoFeB, FeB, or MgFeO. The tunnel barrier layer 35 is a nonmagnetic layer, and includes, for example, MgO or AlO, etc. The tunnel barrier layer 35 may include a nitride of an element such as Al, Si, Be, Mg, Ca, Sr, Ba, Sc, Y, La, Zr, or Hf. The reference layer 36 is a ferromagnetic magnetization fixed layer, and includes, for example, CoFeB, FeB, or MgFeO. That is, the resistance change element RC is configured in such a manner that the nonmagnetic layer (tunnel barrier layer 35) is sandwiched between two ferromagnetic layers (the storage layer 34 and the reference layer 36).

A shift cancellation layer 37 is provided on the resistance change element RC. The shift cancellation layer 37 includes, for example, Co and at least one element selected from Pt, Ni and Pd. A cap layer 38 is provided on the shift cancellation layer 37. The cap layer 38 is a metal layer, and includes at least one of, for example, W, Ta, Ru, Ti, TaN, and TiN. A hard mask 39, which will be described later, including a same material as that of the cap layer 38, may be provided on the cap layer 38.

An MTJ element is configured by a stack of the buffer layer 33, the resistance change element RC, the shift cancellation layer 37, and the cap layer 38. The MTJ element is formed in a columnar shape. An insulating layer 40 is provided on a sidewall (side surface) of the MTJ element (stack). The insulating layer 40 is formed of a re-deposition layer formed of etched materials, including materials constituting the MTJ element and the lower electrode 32.

The buffer layer 33 is designed to enhance crystallization of layers formed thereon. If sufficiently favorable crystallization is achieved without the buffer layer 33, the buffer layer 33 may be omitted.

A protective insulating layer 41 is provided so as to cover the perimeter of the MTJ element and the insulating layer 40. The protective insulating layer 41 is provided with a certain film thickness, so as to extend along the upper surface of the insulating layer 31 from the side surface of the MTJ element and the insulating layer 40. The protective insulating layer 41 is formed of, for example, a silicon nitride layer.

An insulating layer 42 is provided so as to cover the protective insulating layer 41. The insulating layer 42 is formed of, for example, a silicon nitride layer or a silicon oxide layer.

The upper electrode 43 is provided in a contact hole in the insulating layer 42 and the protective insulating layer 41. The upper electrode 43 extends along the stacking direction inside the insulating layer 42 and the protective insulating layer 41. A lower surface of the upper electrode 43 is coupled to an upper surface of the cap layer 38 and the insulating layer 41. The upper electrode 43 is a metal layer containing a metal, and includes at least one of, for example, W, Ta, Ru, Ti, TaN, and TiN. The upper electrode 43 is formed in, for example, a columnar shape.

Here, the upper electrode 43 has a diameter D1 greater than a diameter D2 of the MTJ element. Thereby, the MTJ element (cap layer 38) is coupled to part of the lower surface of the upper electrode 43. For example, a central portion of the lower surface of the upper electrode 43 is coupled to the cap layer 38, and an end portion of the lower surface (perimeter of the central portion of the lower surface) is coupled to the protective insulating layer 41.

The lower surface of the upper electrode 43 is formed to be flat. Thereby, a lowermost portion (lower surface) of the upper electrode 43 is at the same level as an uppermost portion (upper surface) of the cap layer 38 as viewed in the stacking direction. The lowest-level part of the contact surface between the protective insulating layer 41 and the upper electrode 43 is at the same level as the highest-level part of the contact surface between the cap layer 38 and the upper electrode 43 as viewed in the stacking direction.

The upper electrode 43 may have a tapered shape that decreases in diameter from the upper side toward the lower side, and the MTJ element may have a tapered shape that decreases in diameter from the lower side toward the upper side. In this case, the diameter D1 of the upper electrode 43 denotes the smallest diameter (diameter of the lower surface) of the upper electrode 43, and the diameter D2 of the MTJ element denotes the smallest diameter of the MTJ element (diameter of the upper surface of the cap layer 38).

In the present example, the diameter D1 of the upper electrode 43 is smaller than the outer circumference of the protective insulating layer 41, but is not limited thereto. The diameter D1 of the upper electrode 43 may be larger than the outer circumference of the protective insulating layer 41.

A metal layer 44 is provided on the upper electrode 43 and the insulating layer 42. The metal layer 44 corresponds to the bit line BL, and is coupled to an upper surface of the upper electrode 43.

A contact plug 45 is provided in a contact hole in the insulating layers 31 and 42. The contact plug 45 extends along the stacking direction inside the insulating layers 31 and 42. A lower surface of the contact plug 45 is coupled to the diffusion layer 25 (source). An upper surface of the contact plug 45 is coupled to a metal layer (source line SL) (not shown in the drawings).

Figure 4:
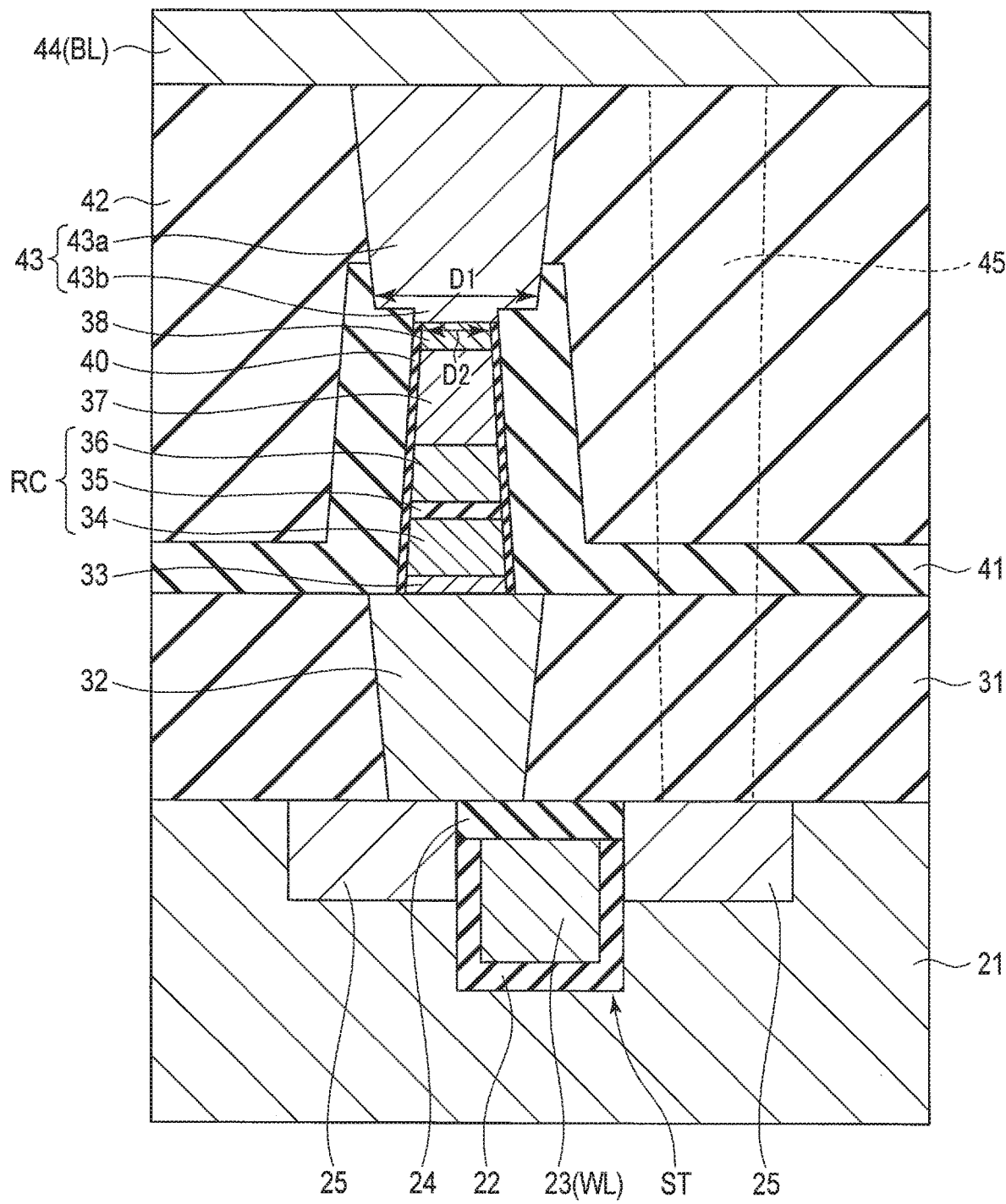
FIG. 4 is a cross-sectional view showing a modification of the memory cell of the semiconductor storage device according to the embodiment.

FIG. 4 is a cross-sectional view showing a modification of the memory cell MC of the semiconductor storage device according to the embodiment.

As shown in FIG. 4, an upper electrode 43 according to the modification includes a first portion 43a and a second portion 43b. The second portion 43b is coupled to a central portion of a lower surface of the first portion 43a, and protrudes downward. A lower surface of the second portion 43b is coupled to an MTJ element (cap layer 38), and the second portion 43b is formed in a columnar shape so as to conform to the MTJ element. An end portion of the lower surface of the first portion 43a is coupled to a protective insulating layer 41.

That is, the lower surface of the upper electrode 43 is shaped in such a manner that its central portion protrudes downward. Thereby, a lowermost portion (lower surface of the second portion 43b) of the upper electrode 43 is at the same level as an uppermost portion (upper surface) of the cap layer 38 as viewed in the stacking direction. The lowest-level part (lower surface of the first portion 43a) of the contact surface between the protective insulating layer 41 and the upper electrode 43 is at a higher level than the highest-level part (lower surface of the second portion 43b) of the contact surface between the cap layer 38 and the upper electrode 43 as viewed in the stacking direction.

Here, the diameter D1 of the upper electrode 43 according to the modification denotes the smallest diameter (diameter of the lower surface of the first portion 43a) of the first portion 43a. The diameter of the second portion 43b is the same as the diameter of the MTJ element.

Figure 5A:
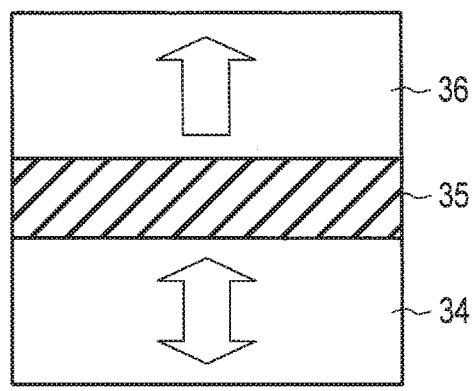
FIG. 5A is a cross-sectional view showing a resistance change element in the semiconductor storage device according to the embodiment.

FIG. 5A is a cross-sectional view showing a resistance change element RC in the semiconductor storage device according to the embodiment.

As described above, the resistance change element RC includes a stacked structure configured by the storage layer 34 formed of a ferromagnetic layer, the reference layer 36 formed of a ferromagnetic layer, and the tunnel barrier layer 35 formed of a non-magnetic layer formed therebetween.

As shown in FIG. 5A, the storage layer 34 is a ferromagnetic layer whose magnetization direction is variable, and has perpendicular magnetic anisotropy in which the magnetization direction is perpendicular or substantially perpendicular to the film surfaces (upper and lower surfaces). The "variable" means that the magnetization direction varies in accordance with a predetermined write current. The "substantially perpendicular" refers to the state where the direction of remnant magnetization is within the range of $45°<\theta\leq90°$, with respect to the film surfaces.

The reference layer 36 is a ferromagnetic layer whose magnetization direction is invariable, and has perpendicular magnetic anisotropy in which the magnetization direction is perpendicular or substantially perpendicular to the film surfaces. The "invariable" means that the magnetization direction does not vary in accordance with the predetermined write current. That is, the reference layer 36 has a bigger energy barrier for inverting the magnetization direction than the storage layer 34.

Figure 5B:
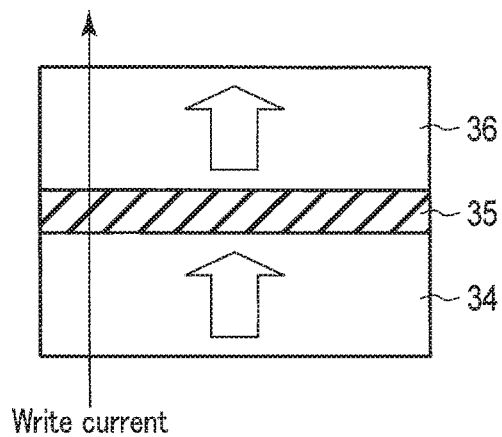
FIG. 5B is a cross-sectional view of the resistance change element in a parallel state (P state), illustrating a write operation of the resistance change element in the semiconductor storage device according to the embodiment.
Figure 5C:
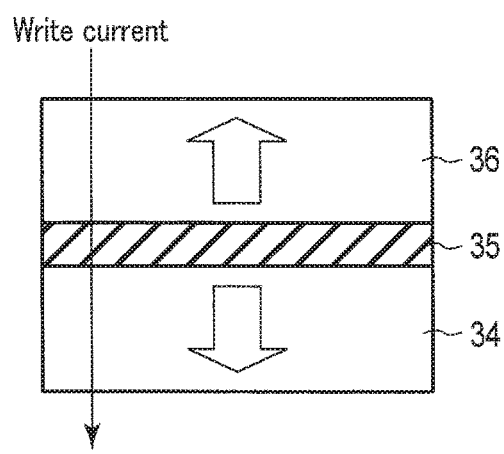
FIG. 5C is a cross-sectional view of the resistance change element in an anti-parallel state (AP state), illustrating a write operation of the resistance change element in the semiconductor storage device according to the embodiment.

FIG. 5B is a cross-sectional view of the resistance change element RC in a parallel state (P state), illustrating a write operation of the resistance change element RC in the semiconductor storage device according to the embodiment. FIG. 5C is a cross-sectional view of the resistance change element RC in an anti-parallel state (AP state), illustrating a write operation of the resistance change element RC in the semiconductor storage device according to the embodiment.

In the present case, the resistance change element RC is, for example, a spin-injection resistance change element. Therefore, when data is written in or read from the resistance change element RC, a current flows through the resistance change element RC in the two directions perpendicular to the film surface.

More specifically, data is written in the resistance change element RC in the following manner.

As shown in FIG. 5B, when a current flows from the storage layer 34 to the reference layer 36, namely, when electrons going from the reference layer 36 to the storage layer 34 are supplied, electrons that are spin-polarized in the same direction as the magnetization direction of the reference layer 36 are injected into the storage layer 34. In this case, the magnetization direction of the storage layer 34 is set to be the same direction as the magnetization direction of the reference layer 36. Thereby, the magnetization direction of the reference layer 36 and the magnetization direction of the storage layer 34 become parallel. In this parallel state, the resistance value of the resistance change element RC is the smallest. Data stored in the resistance change element RC in this state is defined as, for example, "0" data.

On the other hand, as shown in FIG. 5C, when a current flows from the reference layer 36 to the storage layer 34, namely, when electrons going from the storage layer 34 to the reference layer 36 are supplied, electrons that are reflected by the reference layer 36 and are therefore spin-polarized in a direction opposite to the magnetization direction of the reference layer 36 are injected into the storage layer 34. In this case, the magnetization direction of the storage layer 34 and the magnetization direction of the reference layer 36 are set to be opposite to each other. Thereby, the magnetization direction of the reference layer 36 and the magnetization direction of the storage layer 34 become anti-parallel. In this anti-parallel state, the resistance value of the resistance change element RC is the highest. Data stored in the resistance change element RC in this state is defined as, for example, "1" data.

Data is read from the resistance change element RC in the following manner.

A read current is supplied to the resistance change element RC. The read current is set to a value (a value smaller than the write current) that does not invert the magnetization direction of the storage layer 34. By detecting the change in resistance value of the resistance change element RC at this time, the "0" data and the "1" data can be read.

Manufacturing Method According to Embodiment

FIGS. 6-13 are cross-sectional views illustrating a process of manufacturing a memory cell MC of the semiconductor storage device according to the embodiment.

Figure 6:
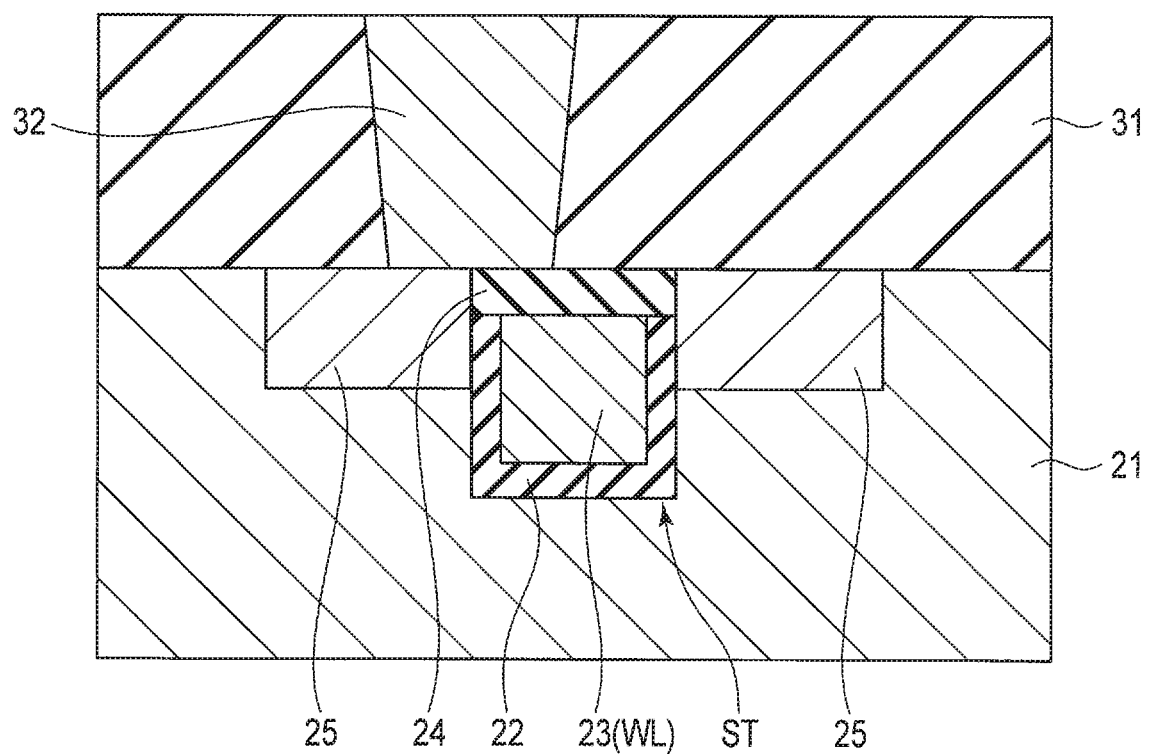
FIG. 6 is a cross-sectional view illustrating a process of manufacturing a memory cell of the semiconductor storage device according to the embodiment.

As shown in FIG. 6, a select transistor ST including a buried gate structure is formed in a surface portion of the semiconductor substrate 21. The select transistor ST is formed in the following manner.

For example, after a recess is formed in the semiconductor substrate 21, a gate insulating layer 22 is formed on a side surface and a bottom of the recess. The gate insulating layer 22 is a silicon oxide layer formed by, for example, thermal oxidation. Next, a gate electrode 23 including polysilicon is formed to fill in a lower portion of the recess. Thereafter, an insulating layer 24, which is formed of a silicon nitride layer, is formed to fill in an upper portion of the recess, and the surface of the insulating layer 24 is planarized. Furthermore, a diffusion layer 25 is formed by introducing impurities into the surface portion of the semiconductor substrate 21 by ion implantation. Thereby, a select transistor ST is formed.

Next, an insulating layer 31 is formed on the semiconductor substrate 21 by means of, for example, chemical vapor deposition (CVD) technique. The insulating layer 31 is formed of, for example, a silicon nitride layer or a silicon oxide layer. In the insulating layer 31, a contact hole (which is not shown in the drawings) that extends along the stacking direction is formed. The contact hole penetrates the insulating layer 31, and reaches the semiconductor substrate 21

(diffusion layer 25). Thereby, the semiconductor substrate 21 (diffusion layer 25) is exposed to the bottom of the contact hole.

Next, a lower electrode 32 is formed in the contact hole by means of, for example, the CVD technique. Thereby, the inside of the contact hole is filled in. A lower surface of the lower electrode 32 is coupled to the diffusion layer 25. The lower electrode 32 is a metal layer containing a metal, and includes at least one of, for example, W, Ta, Ru, Ti, TaN, and TiN.

Next, as shown in FIG. 7, a buffer layer 33 is formed on the lower electrode 32 and the insulating layer 31 by means of, for example, sputtering. The buffer layer 33 includes at least one of, for example, Al, Be, Mg, Ca, Hf, Sr, Ba, Sc, Y, La, and Zr. The buffer layer 33 may include at least one of the compounds such as HfB, MgAlB, HfAlB, ScAlB, ScHfB, and HfMgB.

Next, a storage layer 34, a tunnel barrier layer 35, and a reference layer 36 are sequentially formed on the buffer layer 33 by means of, for example, sputtering. The storage layer 34 and the reference layer 36 include, for example, CoFeB, FeB, or MgFeO. The tunnel barrier layer 35 contains, for example, MgO or AlO. The tunnel barrier layer 35 may include a nitride of an element such as Al, Si, Be, Mg, Ca, Sr, Ba, Sc, Y, La, Zr, or Hf.

Next, a shift cancellation layer 37 is formed on the reference layer 36 by means of, for example, sputtering. The shift cancellation layer 37 includes, for example, Co and at least one element selected from Pt, Ni, and Pd. A cap layer 38 is formed on the shift cancellation layer 37 by means of, for example, sputtering. The cap layer 38 includes at least one of, for example, W, Ta, Ru, Ti, TaN, and TiN. Thereby, a stack for the MTJ element is formed.

Figure 8:
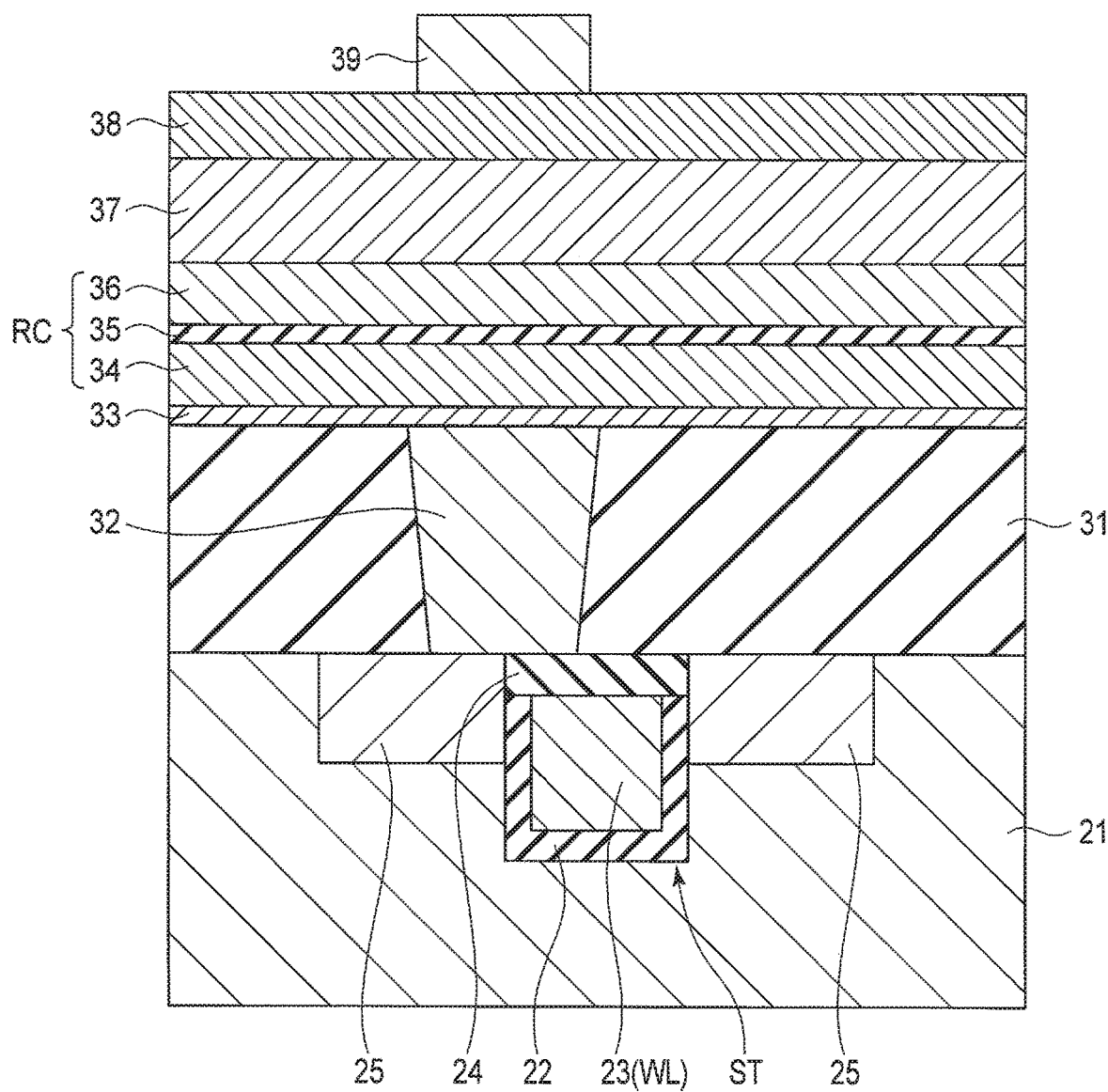
FIG. 8 is a cross-sectional view illustrating a process of manufacturing the memory cell of the semiconductor storage device according to the embodiment.

Next, as shown in FIG. 8, a hard mask 39 is formed on the cap layer 38. The hard mask 39 is patterned to conform to the MTJ element pattern. That is, the hard mask 39 is formed above the lower electrode 32 so as to conform thereto. The hard mask 39 includes a same material as that of the cap layer 38, for example, at least one of W, Ta, Ru, Ti, TaN, and TiN.

Figure 9:
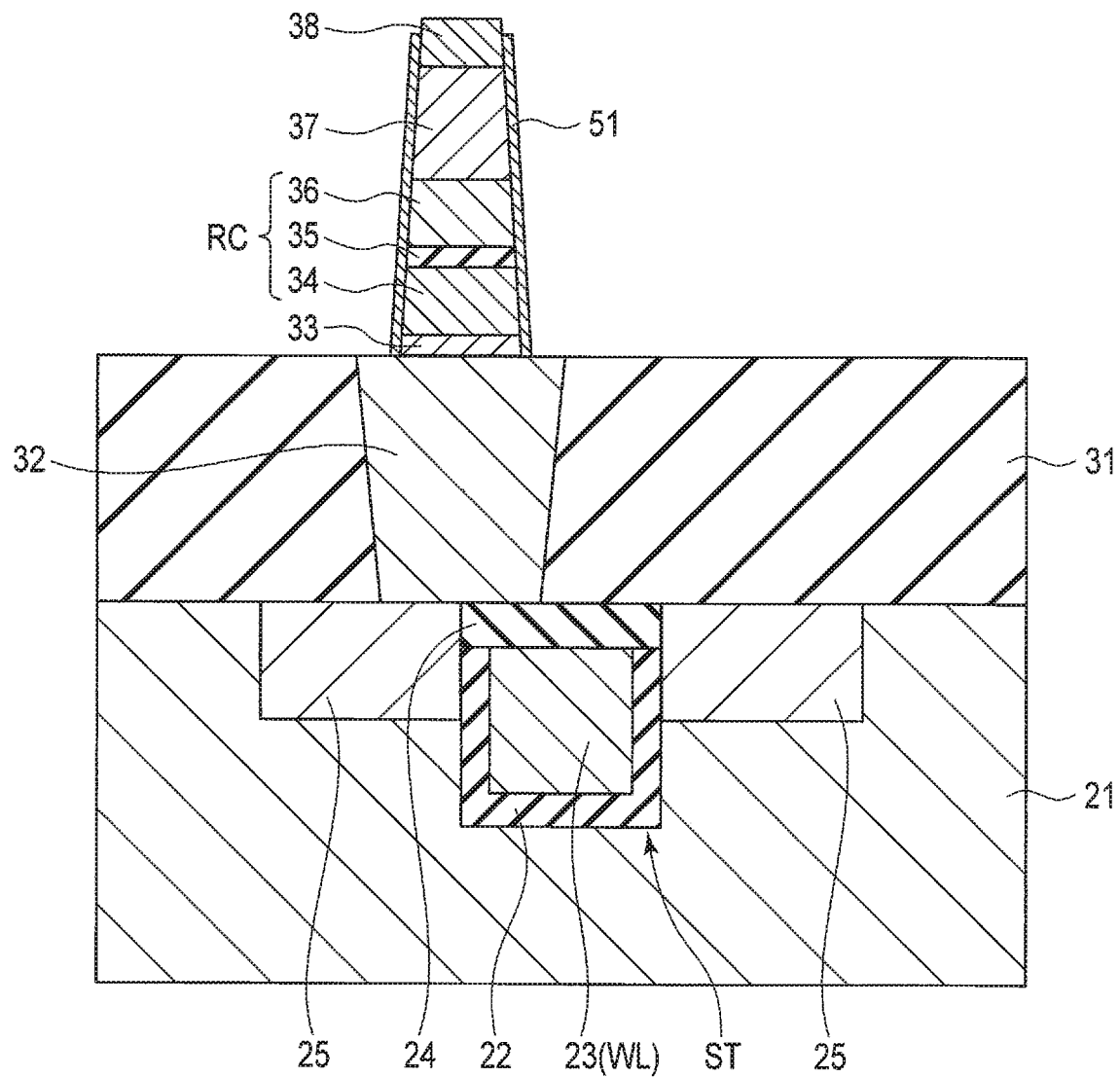
FIG. 9 is a cross-sectional view illustrating a process of manufacturing the memory cell of the semiconductor storage device according to the embodiment.

Next, as shown in FIG. 9, the layers from the cap layer 38 to the buffer layer 33 are etched (patterned) by, for example, the IBE technique using the hard mask 39. This etching reaches the lower electrode 32 and the insulating layer 31. Thereby, an MTJ element configured by a stack of the cap layer 38, the shift cancellation layer 37, the reference layer 36, the tunnel barrier layer 35, the storage layer 34, and the buffer layer 33 is formed. In this case, the hard mask 39 is completely removed; however, the hard mask 39 may remain.

At the same time as the formation of the MTJ element by etching, a sidewall layer 51, which is a re-deposition layer from the layers corresponding to the MTJ element, is formed on a sidewall of the MTJ element. At this time, the layers are over-etched to a level deeper than the buffer layer 33, to completely form the MTJ element. That is, part of the lower electrode 32 is etched. Accordingly, the sidewall layer 51 is a re-deposition layer formed of etched materials, including materials constituting the MTJ element and the lower electrode 32.

Figure 10:
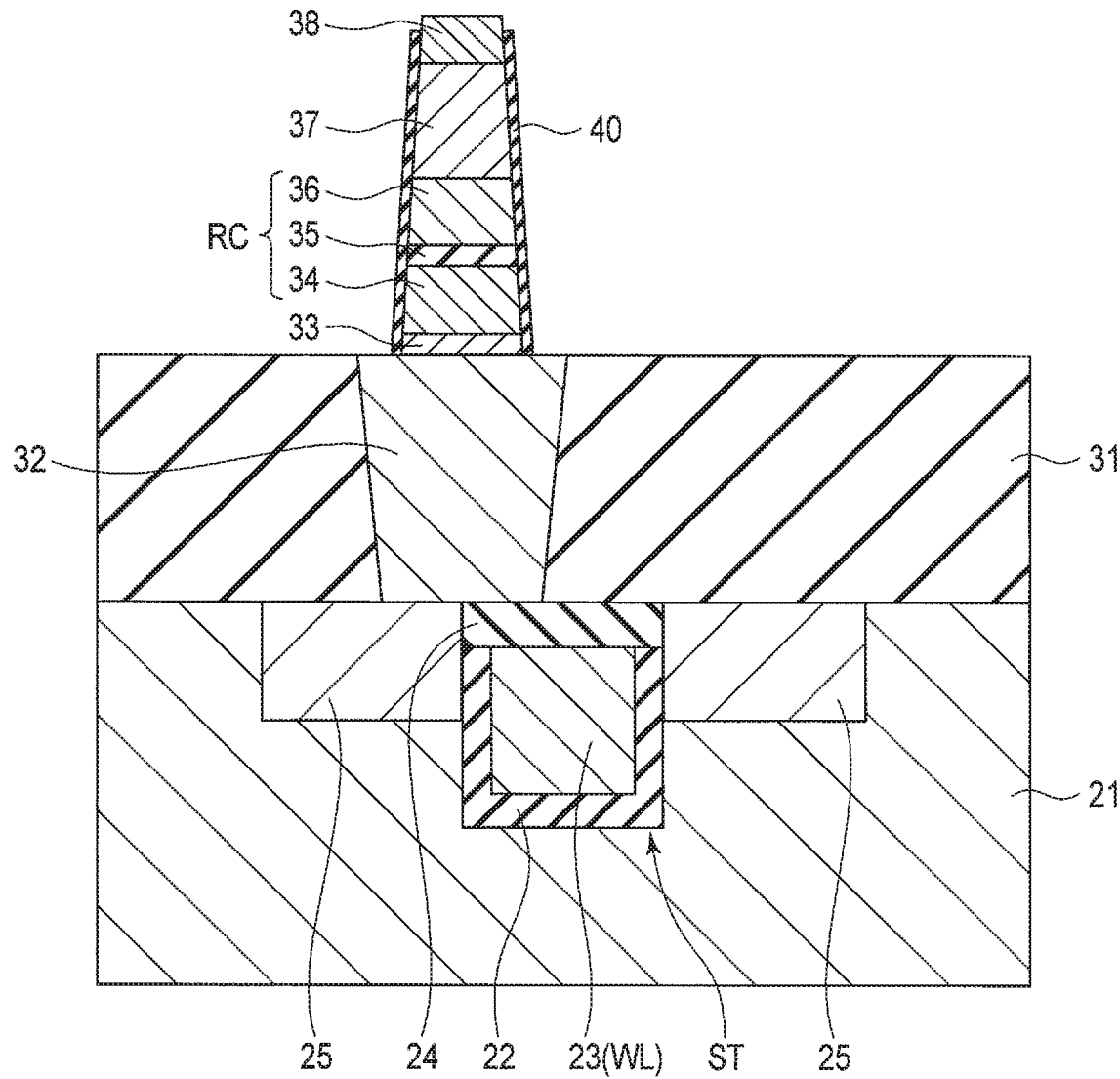
FIG. 10 is a cross-sectional view illustrating a process of manufacturing the memory cell of the semiconductor storage device according to the embodiment.

Next, as shown in FIG. 10, the sidewall layer 51 is oxidized and becomes an insulating layer 40. The insulating layer 40 is formed of an oxide. Thereby, an electrical shortage between the storage layer 34 and the reference layer 36 caused by the sidewall layer 51 can be prevented.

Figure 11:
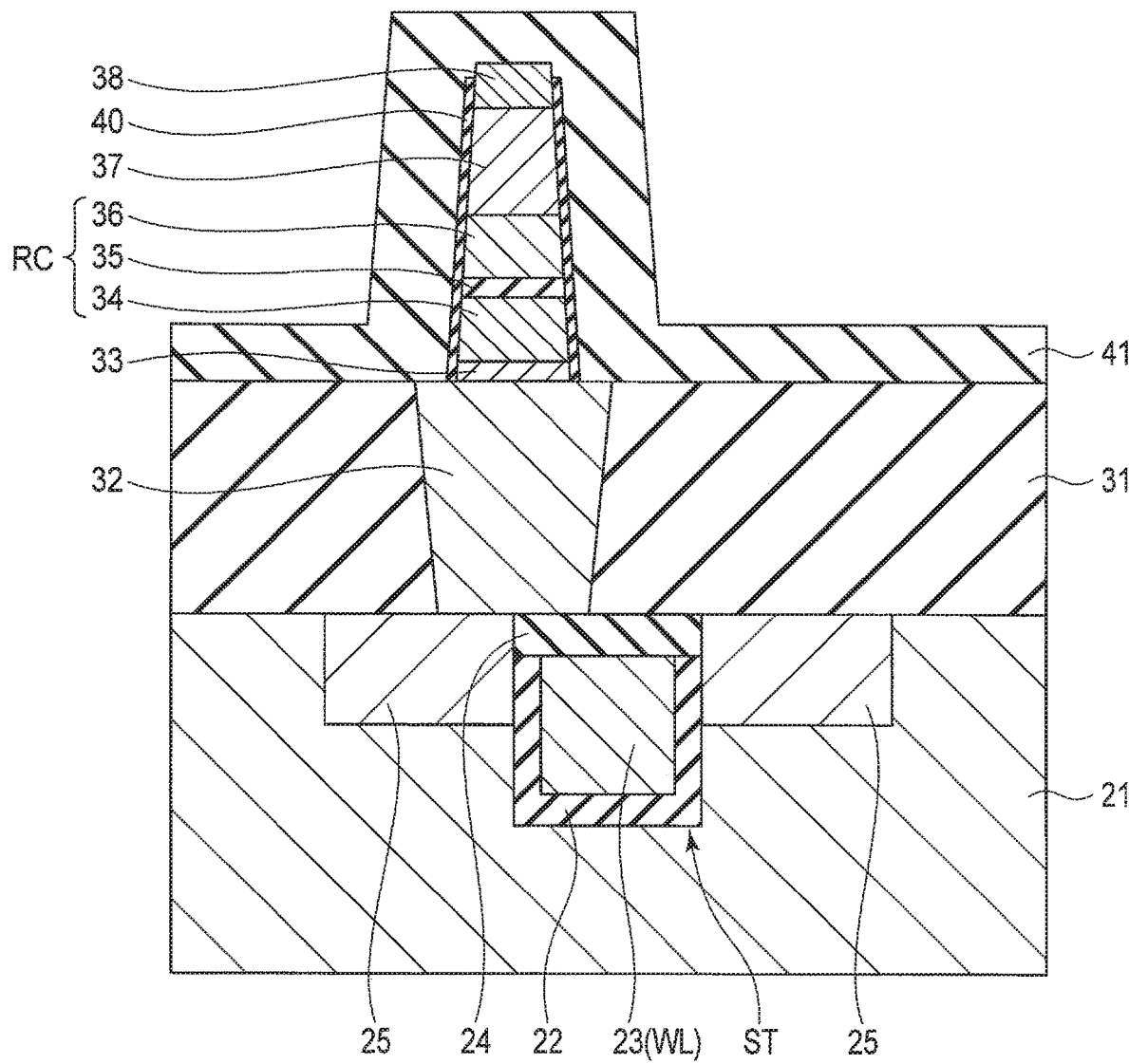
FIG. 11 is a cross-sectional view illustrating a process of manufacturing the memory cell of the semiconductor storage device according to the embodiment.

Next, a protective insulating layer 41 is formed so as to cover the MTJ element, as shown in FIG. 11. The protective insulating layer 41 is formed along the side surface and the upper surface of the MTJ element, and along the upper surface of the insulating layer 31. The protective insulating layer 41 is formed of a nitride layer such as a silicon nitride layer, an aluminum nitride layer, or a hafnium nitride layer.

Figure 12:
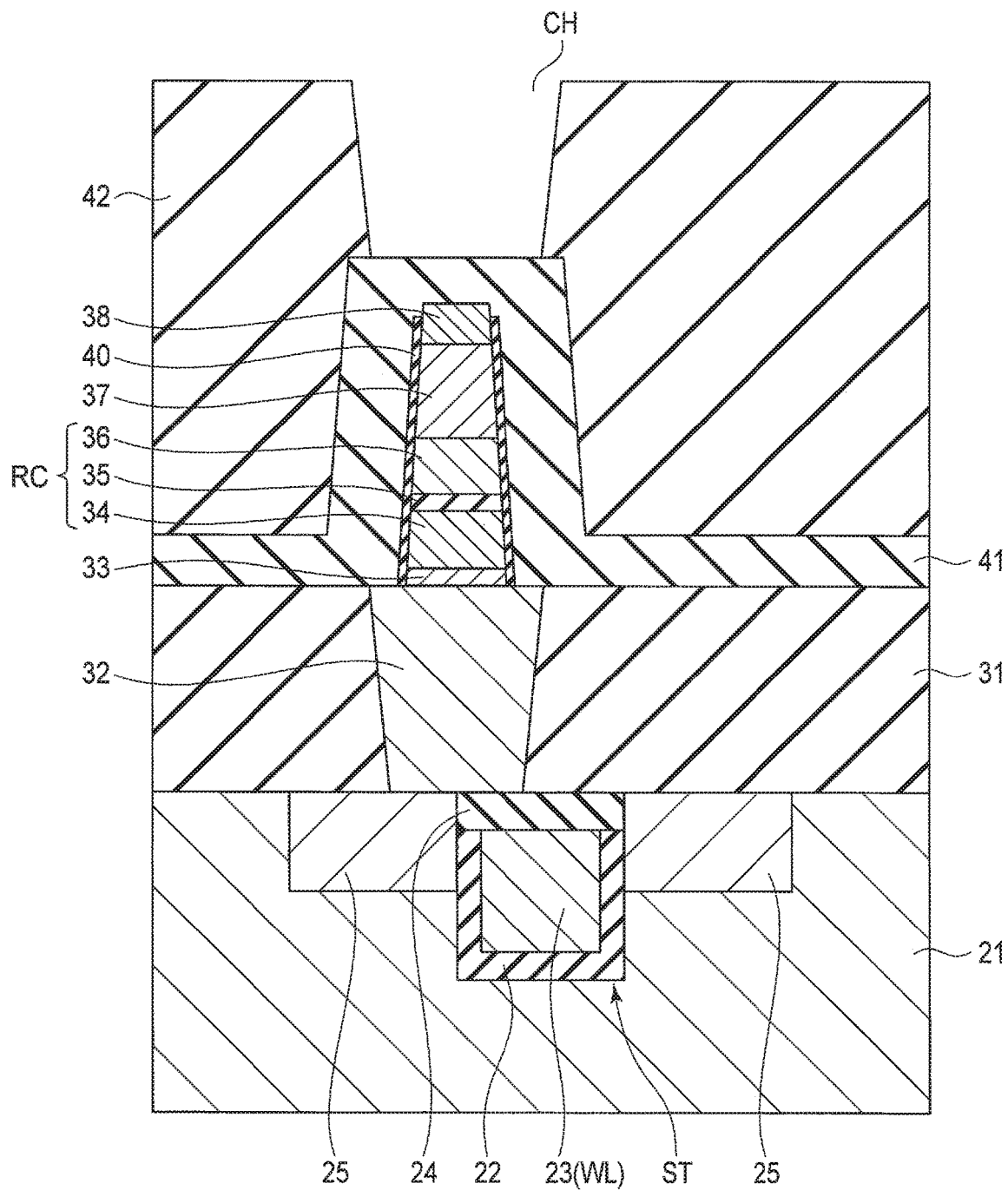
FIG. 12 is a cross-sectional view illustrating a process of manufacturing the memory cell of the semiconductor storage device according to the embodiment.

Next, as shown in FIG. 12, an insulating layer 42 is formed on the entire surface of the protective insulating layer 41 by means of, for example, the CVD technique. The insulating layer 42 is formed of, for example, a silicon nitride layer or a silicon oxide layer. A contact hole CH that reaches the protective insulating layer 41 is formed in the insulating layer 42 by, for example, reactive ion etching (RIE) technique, which uses a mask (not shown in the drawings). The contact hole CH penetrates the insulating layer 42, and reaches the protective insulating layer 41. At this time, RIE produces selectivity between the insulating layer 42 and the protective insulating layer 41. That is, since the etching rate of the protective insulating layer 41 is lower than the etching rate of the insulating layer 42, the etching is completed at the upper surface of the protective insulating layer 41. Thereby, the protective insulating layer 41 is exposed to the bottom of the contact hole CH.

Figure 13:
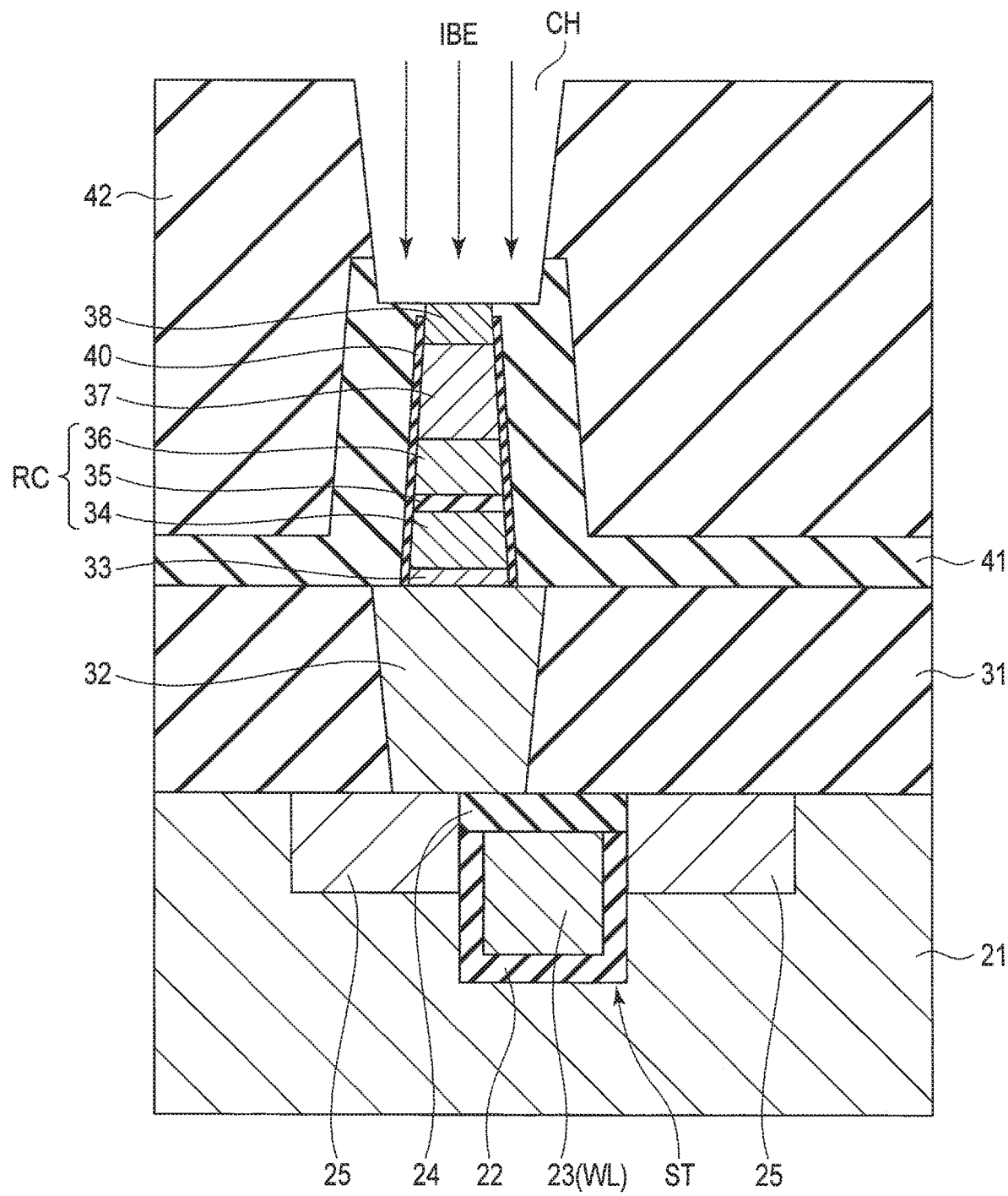
FIG. 13 is a cross-sectional view illustrating a process of manufacturing the memory cell of the semiconductor storage device according to the embodiment.

Next, as shown in FIG. 13, a portion of the protective insulating layer 41 exposed to the bottom of the contact hole CH is etched by means of ion beam etching (IBE) technique. Thereby, the portion of the protective insulating layer 41 at the bottom of the contact hole CH is removed, and the cap layer 38 is exposed to the bottom of the contact hole CH. Examples of inert gases used in the IBE technique includes Ar, Xe, Kr, and Ne. The ion beam angle used in the IBE technique is, for example, zero degrees, but is not limited thereto, and may be any angle that is equal to or lower than the angle at which the ion beams are incident on the bottom of the contact hole CH. The ion beam angle is the angle of ion beams with respect to a direction (stacking direction) perpendicular to the surface of the substrate (semiconductor substrate 21) (where the ion beam angle is assumed as zero degrees).

The diameter of the contact hole CH is greater than the diameter of the MTJ element. Thus, the etching by the IBE technique can be controlled in such a manner that the cap layer 38 is exposed to a central portion of the bottom of the contact hole CH, and the protective insulating layer 41 is exposed to an end portion of the bottom (perimeter of the central portion of the bottom).

Figure 14:
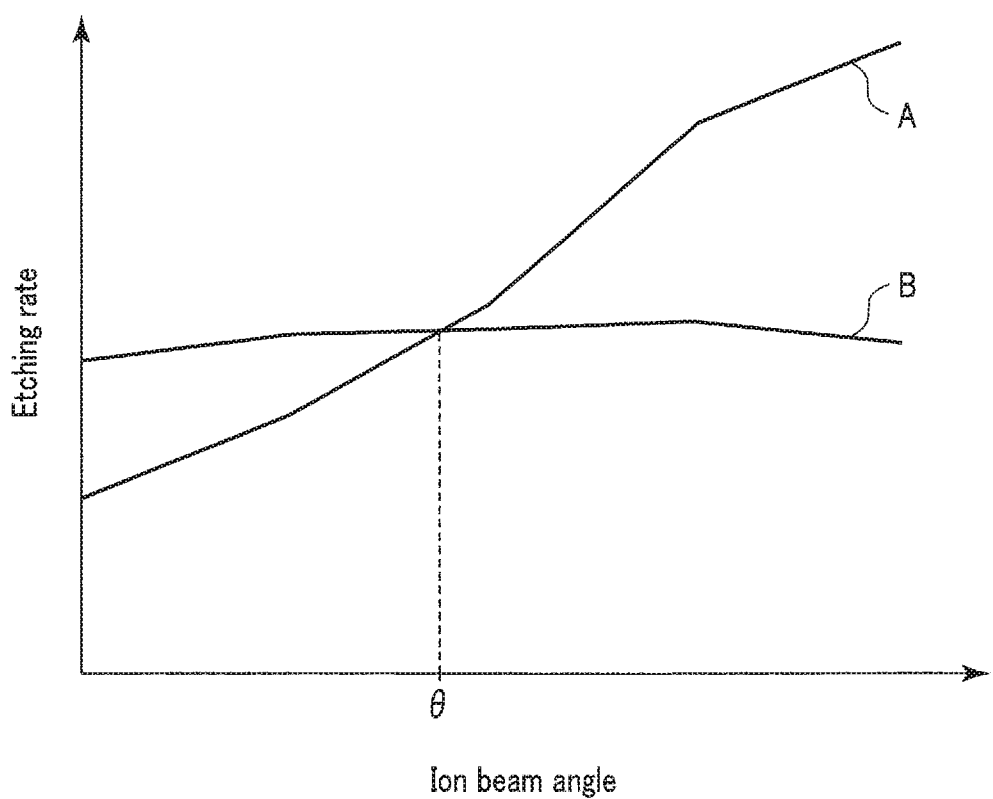
FIG. 14 is a diagram showing a relationship between an ion beam angle and etching rates according to an ion beam etching (IBE) technique.

FIG. 14 is a diagram showing a relationship between the ion beam angle and the etching rates according to the IBE technique. In this diagram, the solid line A shows the etching rate of an insulator such as a silicon nitride, and the solid line B shows the etching rate of a metal such as W, Ta, Ru, Ti, TaN, and TiN. That is, the solid line A shows the etching rate of the protective insulating layer 41, and the solid line B shows the etching rate of the cap layer 38.

As shown in FIG. 14, in the IBE technique, the etching rate of materials to be etched may be controlled by adjusting the ion beam angle. When the ion beam angle is small ($<\theta$), the etching rate of the cap layer 38 is higher than the etching rate of the protective insulating layer 41. When the ion beam angle increases and reaches $\theta$, the etching rate of the protective insulating layer 41 becomes equal to the etching rate of the cap layer 38. When the ion beam angle further increases ($>\theta$), the etching rate of the cap layer 38 becomes lower than the etching rate of the protective insulating layer 41.

When the etching by the IBE technique is controlled in such a manner that the ion beam angle is $\theta$, the bottom of the contact hole CH is formed to be flat. That is, the upper surface of the protective insulating layer 41 at the bottom of the contact hole CH and the upper surface of the cap layer 38 are at the same level as viewed in the stacking direction. Thereafter, wet etching may be performed to remove the re-deposition layer, etc.

Next, as shown in FIG. 3, a metal layer is buried inside a contact hole CH, and an upper electrode 43 is formed. Thereby, the upper electrode 43 having a diameter greater than the diameter of the MTJ element and having a flat lower surface is formed.

Thereafter, a contact hole that reaches the diffusion layer 25 (source) is formed in the insulating layers 42 and 31. A metal layer is buried in the contact hole, and a contact plug 45 is formed.

Furthermore, a metal layer 44, which is to be the bit line BL, is formed on the upper electrode 43. A source line SL is formed on the contact plug 45.

In this manner, a semiconductor device according to the embodiment is formed.

In the process shown in FIG. 13, the cap layer 38 and the protective insulating layer 41 may be over-etched by the IBE technique.

At this time, IBE is performed by adjusting the ion beam angle to lower than θ. By adjusting the ion beam angle to lower than θ, the etching rate of the cap layer 38 can be made higher than the etching rate of the protective insulating layer 41 in the IBE technique.

Thereby, at the bottom of the contact hole CH, the cap layer 38 is etched to a level lower than the protective insulating layer 41. Accordingly, the upper surface of the protective insulating layer 41 at the bottom of the contact hole CH is at a higher level than the upper surface of the cap layer 38 as viewed in the stacking direction.

Thereafter, a metal layer is buried in the contact hole CH, and thereby an upper electrode 43 configured by a first portion 43a and a second portion 43b according to the modification shown in FIG. 4 is formed.

In the above-described modification, the ion beam angle is set to lower than θ, in such a manner that the etching rate of the cap layer 38 is higher than the etching rate of the protective insulating layer 41. Thereby, even in the case of over-etching by the IBE technique, the upper surface of the protective insulating layer 41 at the bottom of the contact hole CH is at a higher level than the upper surface of the cap layer 38 as viewed in the stacking direction.

As described above, it is necessary that the ion beam angle in the IBE technique is equal to or lower than θ, and equal to or lower than the angle at which the ion beams are incident on the bottom of the contact hole CH. In the present embodiment, the ion beam angle in the IBE technique is set to, for example, zero degrees.

Advantageous Effects of Present Embodiment

Figure 15:
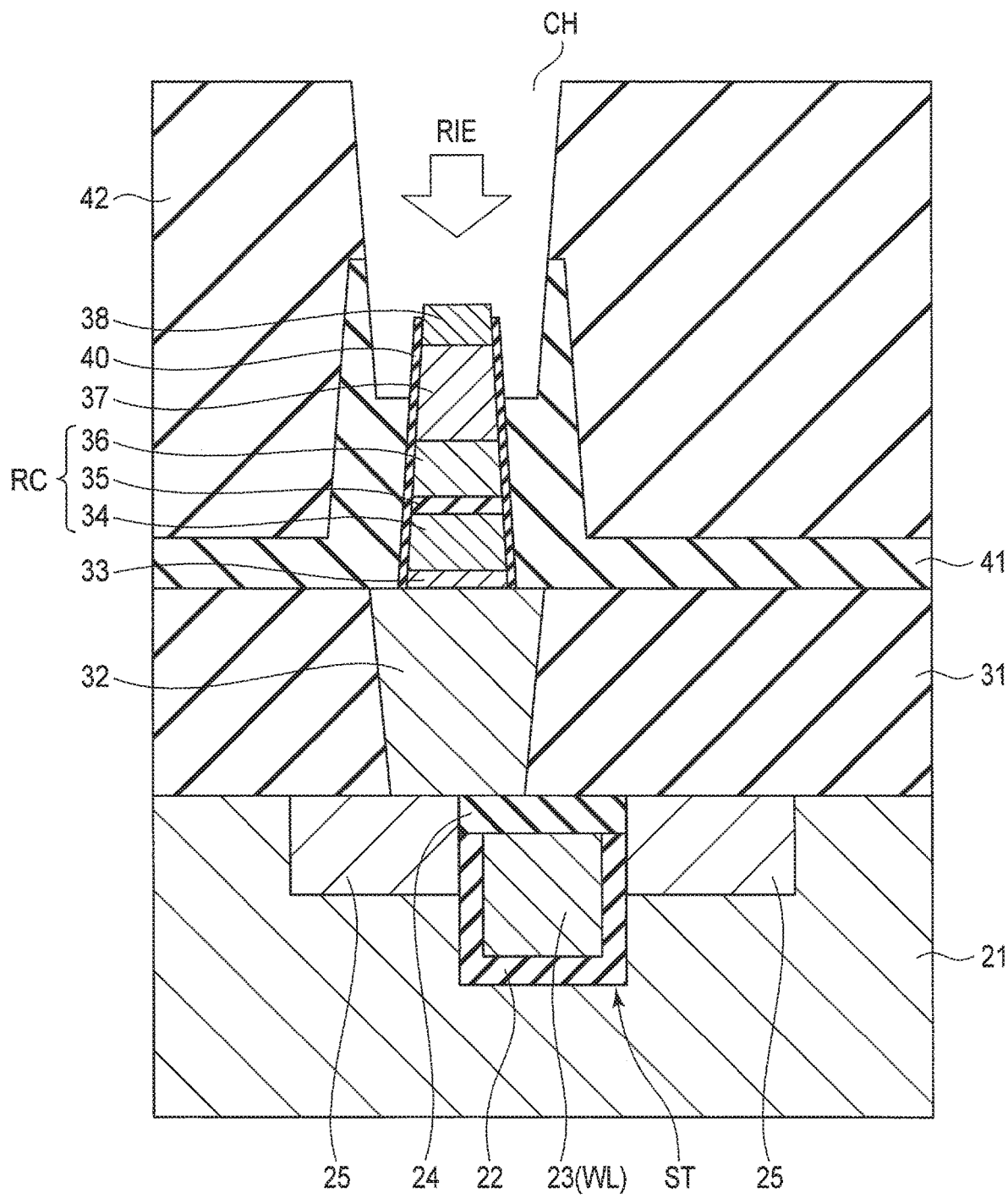
FIG. 15 is a cross-sectional view illustrating a first comparative example of a process of manufacturing the memory cell of the semiconductor storage device according to the embodiment.

FIG. 15 is a cross-sectional view illustrating a first comparative example of a process of manufacturing the memory cell MC of the semiconductor storage device according to the embodiment.

As shown in FIG. 15, in the first comparative example, RIE is performed to remove a portion of the protective insulating layer 41 at the bottom of the contact hole CH. Thereby, the cap layer 38 is exposed to the bottom of the contact hole CH. However, according to the RIE technique, the etching rate of the protective insulating layer 41 is higher than the etching rate of the cap layer 38. Thus, in over-etching after the exposure of the cap layer 38, only the protective insulating layer 41 is selectively etched. This causes the side surface of the MTJ element (in particular, the shift cancellation layer 37) to be exposed. Consequently, when wet etching is performed to remove the residual gas, for example, the MTJ element is damaged, causing deterioration in the memory cell characteristics (MTJ magnetic characteristics).

Figure 16:
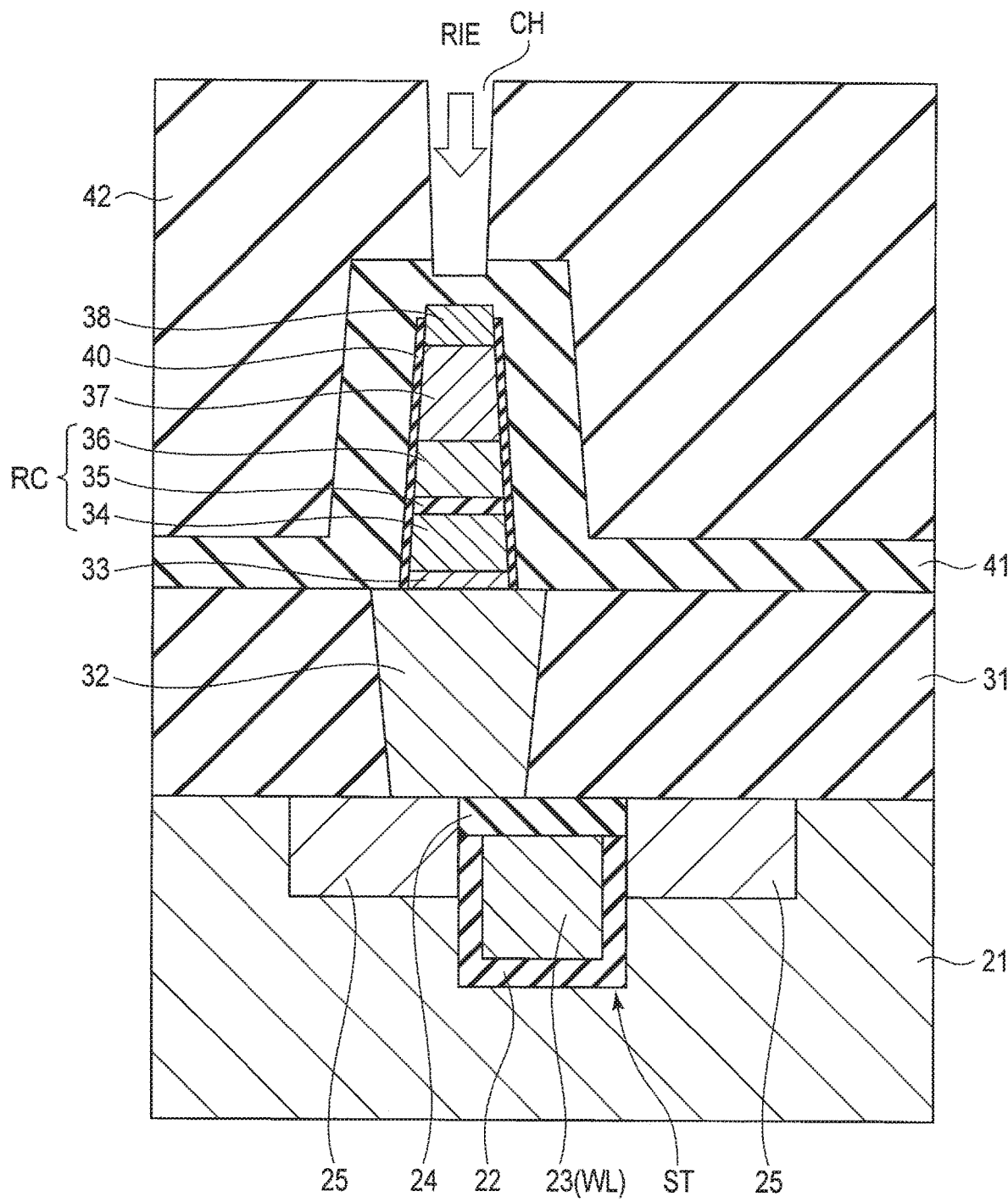
FIG. 16 is a cross-sectional view illustrating a second comparative example of a process of manufacturing the memory cell of the semiconductor storage device according to the embodiment.

FIG. 16 is a cross-sectional view illustrating a second comparative example of a process of manufacturing the memory cell MC of the semiconductor storage device according to the embodiment.

As shown in FIG. 16, in the second comparative example, RIE is performed in a manner similar to the first comparative example, to remove a portion of the protective insulating layer 41 at the bottom of the contact hole CH. In the second comparative example, the diameter of the contact hole CH is set to be smaller than the diameter of the MTJ element. Thereby, only the cap layer 38 is exposed to the bottom of the contact hole CH. Accordingly, it is possible to prevent over-etching of the protective insulating layer 41 as in the first comparative example. However, when the diameter of the contact hole CH is decreased, it becomes difficult to completely remove the portion of the protective insulating layer 41 at the bottom of the contact hole CH by the RIE technique. Consequently, the cap layer 38 cannot be exposed to the bottom of the contact hole CH, and it becomes difficult to provide coupling between the upper electrode 43 and the cap layer 38. This increases the possibility that the electrical contact between the upper electrode 43 and the cap layer 38 is lost (open failure occurs).

On the other hand, according to the above-described present embodiment, the diameter of the contact hole CH is formed to be greater than the diameter of the MTJ element, and IBE is performed to remove the portion of the protective insulating layer 41 at the bottom of the contact hole CH. By increasing the diameter of the contact hole CH, the portion of the protective insulating layer 41 at the bottom can be completely removed. Thereby, the cap layer 38 can be easily exposed to the bottom of the contact hole CH. Therefore, it is possible to prevent the problem of the second comparative example.

According to the IBE technique of the present embodiment, the etching rate of the cap layer 38 is set to be the same as, or higher than the etching rate of the protective insulating layer 41. Thus, in over-etching after the exposure of the cap layer 38, the cap layer 38 and the protective insulating layer 41 are etched to the same level, or the cap layer 38 is etched to a level lower than the protective insulating layer 41. Thereby, it is possible to prevent the exposure of the side surface of the MTJ element (in particular, the shift cancellation layer 37). Therefore, it is possible to prevent the problem of the first comparative example, and to suppress deterioration in MTJ magnetic characteristics.

The present embodiment has been explained with respect to the memory cell MC shown in FIGS. 3 and 4, but is applicable to a modification that will be described below.

Figure 17:
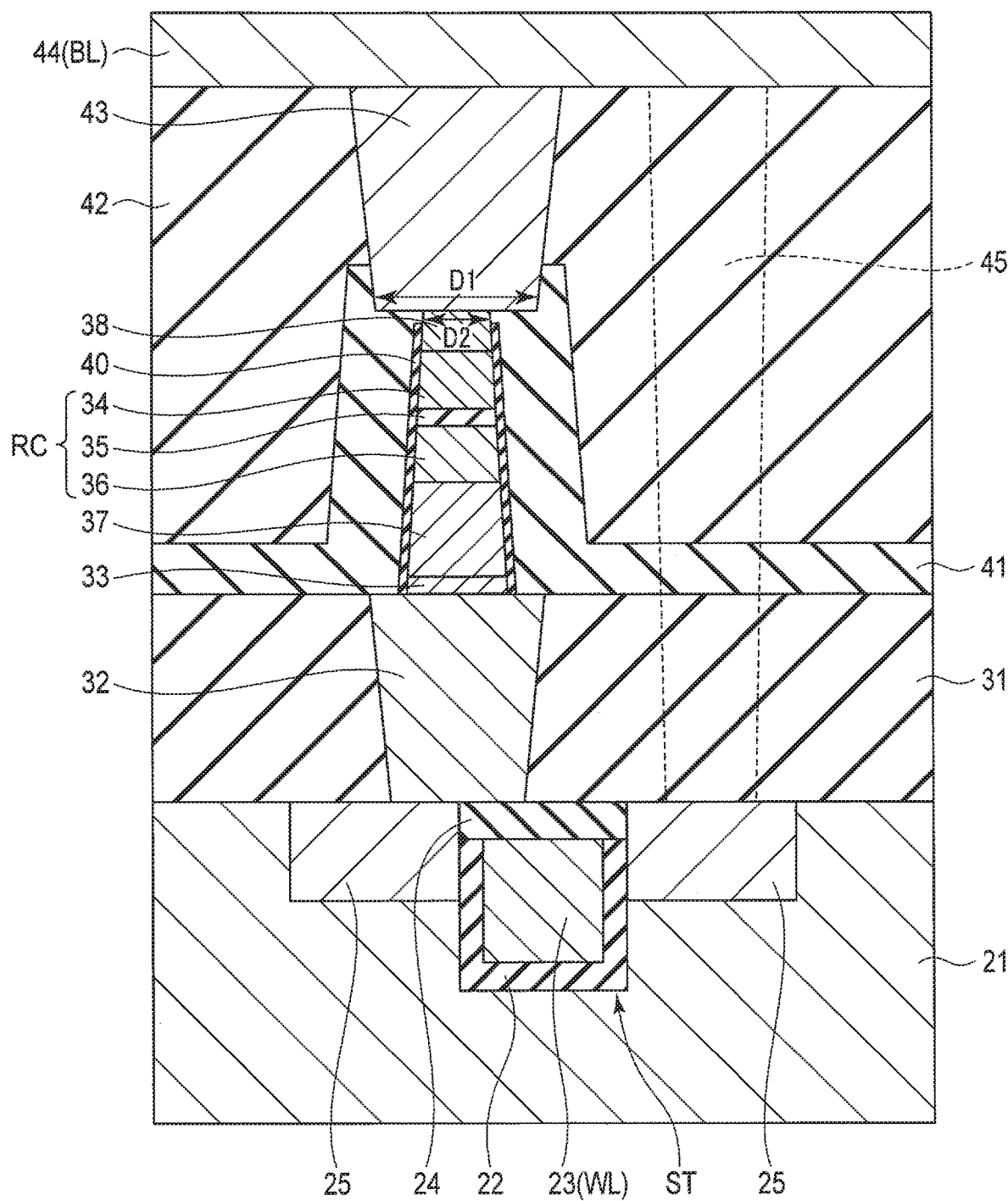
FIG. 17 is a cross-sectional view showing a modification of the memory cell shown in FIG. 3.
Figure 18:
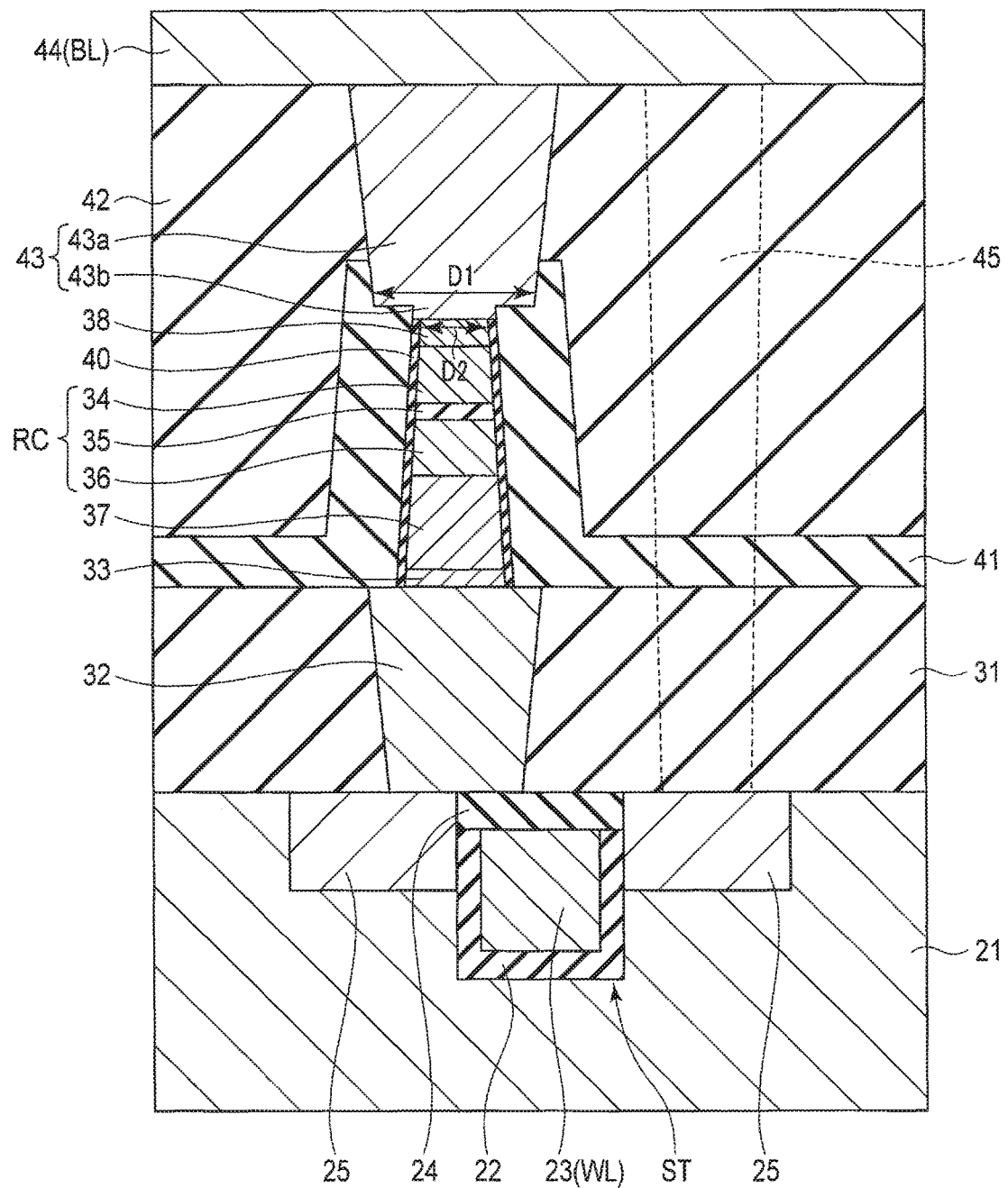
FIG. 18 is a cross-sectional view showing a modification of the memory cell shown in FIG. 4.

FIG. 17 is a cross-sectional view showing a modification of the memory cell MC shown in FIG. 3, and FIG. 18 is a cross-sectional view showing a modification of the memory cell MC shown in FIG. 4.

In FIGS. 3 and 4, the storage layer 34, the tunnel barrier layer 35, and the reference layer 36 are arranged in this order from the side of the lower portion in the MTJ element. On the other hand, the storage layer 34 and the reference layer 36 may be reversed, as shown in FIGS. 17 and 18. In this case, the shift cancellation layer 37 may also be rearranged. That is, the shift cancellation layer 37, the reference layer 36, the tunnel barrier layer 35, and the storage layer 34 are sequentially arranged in this order from the side of the lower portion in the MTJ element.

Furthermore, in the above embodiments and the modifications, the switching element of the memory cell MC is described as the select transistor ST which is an example of a switching element having three terminals in FIG. 1 and FIG. 2; however, the configuration is not limited thereto. For example, the switching element having two terminals can also be applied to the above first embodiment and the modifications.

That is, the select transistor may be, for example, a switch element operating between two terminals. As one example, in a case where a voltage applied between the two terminals is equal to or less than a threshold, the switch element is in a "high resistance" state, for example, an electrically non-conductive state. In a case where a voltage applied between the two terminals is equal to or larger than a threshold, the switch element changes to a "low resistance" state, for example, an electrically conductive state. The switch element can be configured to perform this function regardless of a polarity of voltage.

In this example, the switch element may include at least one chalcogen element selected from among a group configured with tellurium (Te), selenium (Se), and sulfur (S). Alternatively, the switch element may include chalcogenide that is a compound including the chalcogen element. In addition to this, the switch element may contain at least one element selected from among the group configured with boron (B), aluminum (Al), gallium (Ga), indium (In), carbon (C), silicon (Si), germanium (Ge), tin (Sn), arsenic (As), phosphorus (P), and Sb (antimony).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
    a substrate;
    a stack provided above the substrate, the stack including a resistance change element and a metal layer provided above the resistance change element, wherein the stack includes a magnetic layer adjacent to the metal layer;
    a first insulating layer provided on a side surface of the stack;
    a second insulating layer provided on the first insulating layer; and
    an electrode provided on the metal layer and on the first insulating layer so as to extend along a stacking direction in the second insulating layer, wherein when viewed in the stacking direction, a lower surface of the electrode has a diameter greater than a diameter of an upper surface of the stack, and a lowermost portion of the electrode is at a same level as an uppermost portion of the metal layer.

2. The device according to claim 1, wherein a lowest-level part of a contact surface between the first insulating layer and the electrode is at a same level as a highest-level part of a contact surface between the metal layer and the electrode.

3. The device according to claim 1, wherein a lowest-level part of a contact surface between the first insulating layer and the electrode is at a higher level than a highest-level part of a contact surface between the metal layer and the electrode.

4. The device according to claim 1, wherein the metal layer includes at least one of W, Ta, Ru, Ti, TaN, and TiN.

5. The device according to claim 1, wherein the first insulating layer includes SiN.

6. The device according to claim 1, wherein the resistance change element includes the magnetic layer.

7. The device according to claim 1, wherein the magnetic layer is provided between the resistance change element and the metal layer.

8. The device according to claim 1, wherein the metal layer is provided on the magnetic layer.

9. The device according to claim 1, wherein an etching rate of the metal layer is equal to or higher than an etching rate of the first insulating layer with respect to an ion beam etching performed at an ion beam angle relative to the stacking direction.

10. The device according to claim 1, wherein the metal layer comprises a first material and the electrode comprises a second material that is different from the first material.

11. The device according to claim 1, wherein a diameter of a lowest surface of the electrode is equal to or greater than a diameter of an upper surface of the metal layer.

12. The device according to claim 1, wherein the lower surface of the electrode is a lowest surface of the electrode.

13. The device according to claim 1, wherein the lower surface of the electrode is above a lowest surface of the electrode.

* * * * *